(12) United States Patent
Trimberger

(10) Patent No.: US 6,624,654 B1
(45) Date of Patent: Sep. 23, 2003

(54) METHODS FOR IMPLEMENTING CIRCUITS IN PROGRAMMABLE LOGIC DEVICES TO MINIMIZE THE EFFECTS OF SINGLE EVENT UPSETS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/150,044

(22) Filed: May 16, 2002

(51) Int. Cl.[7] .......................................... H03K 19/175
(52) U.S. Cl. .......................... 326/14; 326/9; 326/10; 326/11; 326/38; 326/41; 716/6; 716/16; 716/18
(58) Field of Search ........................ 326/9–11, 14, 326/38–41; 716/6, 16, 18

(56) References Cited

U.S. PATENT DOCUMENTS

| | | |
|---|---|---|
| 4,695,740 A | 9/1987 | Carter |
| 4,713,557 A | 12/1987 | Carter |
| 4,835,418 A | 5/1989 | Hsieh |
| 5,031,180 A * | 7/1991 | McIver et al. ............... 714/797 |
| RE34,363 E | 8/1993 | Freeman |
| 5,517,135 A | 5/1996 | Young |
| 5,925,920 A * | 7/1999 | MacArthur et al. ......... 257/530 |
| 6,104,211 A * | 8/2000 | Alfke ........................... 326/91 |
| 6,526,559 B2 * | 2/2003 | Schiefele et al. ............. 716/16 |

* cited by examiner

Primary Examiner—Michael Tokar
Assistant Examiner—Vibol Tan
(74) Attorney, Agent, or Firm—Lois D. Cartier

(57) ABSTRACT

Methods for implementing a circuit in a programmable logic device (PLD) that protect the circuit from the effects of single event upsets. When routing nodes within the circuit using the interconnect lines of the PLD, two routed nodes are separated from each other by at least two programmable interconnect points (PIPs). Therefore, if a single event upset causes a PIP to become inadvertently enabled, the affected node is coupled to an unused interconnect line, instead of to another node within the circuit. In some embodiments, a triple modular redundancy (TMR) circuit is implemented. Signals in one module are separated from signals in another module by at least two PIPS. However, signals within the same module can be separated by only one PIP, because the TMR structure of the circuit can compensate for errors within a single module.

25 Claims, 6 Drawing Sheets

METHODS FOR IMPLEMENTING CIRCUITS IN PROGRAMMABLE LOGIC DEVICES TO MINIMIZE THE EFFECTS OF SINGLE EVENT UPSETS

FIELD OF THE INVENTION

The invention relates to programmable logic devices (PLDs) subject to single event upsets. More particularly, the invention relates to methods of generating high reliability designs for PLDs on which single event upsets have minimal impact.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAM, and so forth).

The various logic blocks are interconnected by a programmable interconnect structure that includes a large number of programmable interconnect lines (e.g., metal wires). The interconnect lines and logic blocks are interconnected using programmable interconnect points (PIPs). A PIP can be, for example, a CMOS passgate. When the passgate is turned on (i.e., the PIP is enabled), the two nodes on either side of the passgate are electrically connected. When the passgate is turned off (i.e., the PIP is disabled), the two nodes are isolated from each other. Thus, by controlling the values on the gate terminals of the PIPS, circuit connections can be easily made and altered.

PIPs can be implemented in many different ways. For example, a buffered PIP can be implemented as a tristate buffer. When the tristate signal is low, the buffer output is not driven, and the two nodes on either side of the buffer are isolated. When the tristate signal is high, one of the nodes drives the other node in a unidirectional connection.

Various exemplary types of PIPs are described by Freeman in U.S. Pat. No. Re. 34,363, by Carter in U.S. Pat. Nos. 4,695,740 and 4,713,557, by Hsieh in U.S. Pat. No. 4,835,418, and by Young in U.S. Pat. No. 5,517,135, all of which are hereby incorporated by reference. Some PIPs are unidirectional and some are bidirectional. Some are buffered and some are not buffered. However, the various types of PIPs typically have this in common, that they are controlled by a single data value stored in a memory cell called a configuration memory cell.

The logic blocks and PIPs in a PLD are typically programmed (configured) by loading configuration data into thousands of configuration memory cells that define how the CLBS, IOBs, and interconnect lines are configured and interconnected. In Field Programmable Gate Arrays (FPGAs), for example, each configuration memory cell is implemented as a static RAM cell.

When subjected to unusual conditions such as cosmic rays or bombardment by neutrons or alpha particles, a static RAM cell can change state. For example, a stored high value can be inadvertently changed to a low value, and vice versa. Sometimes these "single event upsets" have no effect on the functionality of the chip. At other times, a single event upset can change the function of a PLD such that the circuit no longer functions properly.

FIG. 1 shows a portion of a PLD that includes three logic blocks LB1–LB3, five interconnect lines IL0–IL4, and four PIPs P1–P4. Interconnect lines IL1–IL3 are coupled to logic blocks LB1–LB3, respectively. For simplicity, interconnect lines IL1–IL3 are shown directly connected to the corresponding logic blocks. In practice, the interconnect lines do not necessarily connect directly to the logic blocks, but can pass through additional PIPs to reach the logic blocks. Interconnect lines IL1–IL3 can each be programmably coupled to interconnect line IL0 through PIPs P1–P3, respectively. Interconnect line IL4 can be programmably coupled to interconnect line IL3 through PIP P4.

PIPs P1–P4 are respectively controlled by four memory cells MC1–MC4. When the value stored in one of the memory cells is high, the passgate in the associated PIP is enabled. When the value stored in one of the memory cells is low, the interconnect lines on either side of the associated PIP are not connected together. They can be left unconnected or wired as parts of two separate circuits.

As an example, consider the case where memory cells MC1, MC2, and MC4 each store a high value and memory cell MC3 stores a low value. PIPs P1 and P2 are enabled, connecting together interconnect lines IL1, IL0, and IL2. PIP P4 is also enabled, connecting together interconnect lines IL3 and IL4. PIP P3 is disabled. Further consider that logic block LB1 is driving a signal on interconnect line. IL1 and logic block. LB3 is driving a signal on interconnect line IL3. For example, PIPs P1 and P3 can be included in output drivers of the CLBs including logic blocks LB1 and LB3, respectively. PIPs P1–P4 can also form part of multiplexer structures within logic blocks or CLBs, or within the programmable interconnect structure of the PLD.

Now suppose a single event upset occurs at memory cell MC1, and the value stored in memory cell MC1 changes from a high value to a low value. PIP P1 is inadvertently disabled, and interconnect line IL1 is isolated from interconnect line IL0. If logic block LB1 was driving logic block LB2 through interconnect line IL0, for example, the connection no longer exists, and the circuit does not function properly.

Suppose instead that a single event upset occurs at memory cell MC3 and the value stored in memory cell MC3 changes from a low value to a high value. PIP P3 is inadvertently enabled. Logic block LB3 tries to place a value on interconnect line IL0, which is already driven by logic block LB1. Contention occurs, which can cause a number of problems ranging from excessive current consumption to a malfunctioning circuit to causing actual damage to the PLD.

Circuits and methods have been developed to avoid the problems associated with single event upsets in non-programmable circuits. One strategy for avoiding such problems is illustrated in FIG. 2. The illustrated circuit is called a triple modular redundancy (TMR) circuit. In essence, the required logic is implemented three times (i.e., in three modules), and the results generated by the three modules are compared. The two that are the same are considered to be correct, and the "dissenting vote" is thrown out.

The TMR circuit of FIG. 2 includes modules M1–M3, representing three implementations of the same logical function. Each module has a respective output signal 01–03 that drives voting circuit VC. Voting circuit VC implements the function (01 AND 02) OR (02 AND 03) OR (01 AND 03) and provides the result as the output signal OUT of the circuit.

Clearly, this approach overcomes any single event upset that affects the functionality of one of the three modules M1–M3. The module affected by the event produces an incorrect answer, which is overridden in the voting circuit by the other two modules.

However, while the circuit of FIG. 2 works well for errors that occur within one of modules M1–M3, it does not work as well when the circuit is implemented in a PLD. In a PLD, the programmable nature of the routing can cause errors that are more difficult to detect. Specifically, a single event upset that changes the value stored in a PIP memory cell can short together two of the module output signals 01–03. In this event, two of the three inputs to the voting circuit can be incorrect.

Further, circuits implemented in a PLD are not necessarily implemented in discrete regions of the device. The best implementation of the circuit of FIG. 2 in terms of performance or minimizing resource usage might be to physically intermix the logic for the three modules M1–M3. In that case, internal nodes in two different modules can easily be separated by only a single disabled PIP. If a single event upset inadvertently enables such a PIP, internal nodes from the two modules are shorted together. Again, two of three modules are providing suspect data to the voting circuit.

Similarly, single event upsets can cause inadvertent connections between a node in one of the modules and a node in the voting circuit, or between two different nodes in a voting circuit, or between nodes in two different voting circuits.

Further, while a TMR circuit can render a logical function immune from the effects of a single event upset, they do not prevent damage to the PLD that can result from contention caused by the event. Even when the PLD is not damaged, the large amount of power that can be consumed by such a contention is a serious issue in many applications.

Therefore, it is desirable to provide methods for implementing circuits in PLDs that offer protection from the effects of single event upsets. It is further desirable to provide methods for implementing TMR circuits that render such circuits as effective in PLDs as in non-programmable integrated circuits.

SUMMARY OF THE INVENTION

The invention provides methods for implementing a circuit in a programmable logic device (PLD) that protect the circuit from the effects of single event upsets. When routing nodes within the circuit using the interconnect lines of the PLD, two routed nodes are separated from each other by at least two programmable interconnect points (PIPs). Therefore, if a single event upset causes a PIP to become inadvertently enabled, the affected node is coupled to an unused interconnect line, instead of to another node within the circuit.

In some embodiments, a triple modular redundancy (TMR) circuit is implemented. Routed nodes in one module are separated from routed nodes in another module by at least two PIPs. However, nodes within the same module can be separated by only one PIP, because the TMR structure of the circuit can compensate for errors that are confined to a single module.

A method according to a first embodiment maps a circuit including two sub-circuits and two nodes coupled to the two sub-circuits into a PLD with logic blocks and interconnect lines. The method includes the steps of assigning the two sub-circuits to logic blocks within the PLD, assigning the first node to a first interconnect line in the PLD, marking the first interconnect line as used, marking all interconnect lines within one PIP of the first interconnect line as used, and assigning the second node to a second interconnect line while avoiding all interconnect lines, marked as used. Thus, a single event upset that inadvertently enables one PIP cannot short the first and second nodes together.

In some embodiments, the method is applied to a TMR circuit, with the first and second nodes being output nodes from first and second modules. In other embodiments, the first and second nodes are in one of the modules and the voting circuit. In still other embodiments, interconnect lines within one PIP of the used interconnect line are marked as used with respect to nodes in other modules, but not marked as used with respect to nodes in the same module.

A method according to another embodiment also maps a circuit including two sub-circuits and two nodes coupled to the two sub-circuits into a PLD with logic blocks and interconnect lines. In this embodiment, the method includes the steps of assigning the two sub-circuits to logic blocks within the PLD, routing the first node using a first interconnect line in the PLD, and routing the second node using a second interconnect line in the PLD wherein connecting the first and second interconnect lines to each other would require the enabling of more than one PIP. Again, a single event upset that inadvertently enables one PIP cannot short the first and second nodes together.

A method according to another embodiment addresses the steps of implementing a triple modular redundancy (TMR) circuit in a PLD. According to this embodiment, the method includes the steps of implementing three modules and a voting circuit in the PLD, and routing output nodes from each module to input terminals of the voting circuit using only unused interconnect lines. After routing each of the first and second output nodes using associated interconnect lines, the associated interconnect lines are marked as used. All interconnect lines programmably connectable to the associated interconnect lines through a single PIP are also marked as used.

In some embodiments, interconnect lines within one PIP of an assigned interconnect line are only marked as used with respect to nodes in other modules, and not with respect to nodes within the same module. This improvement increases the number of interconnect lines available for routing the modules.

BRIEF DESCRIPTION OF THE DRAWINGS

The present invention is illustrated by way of example, and not by way of limitation, in the following figures.

DETAILED DESCRIPTION OF THE DRAWINGS

Figure 3:
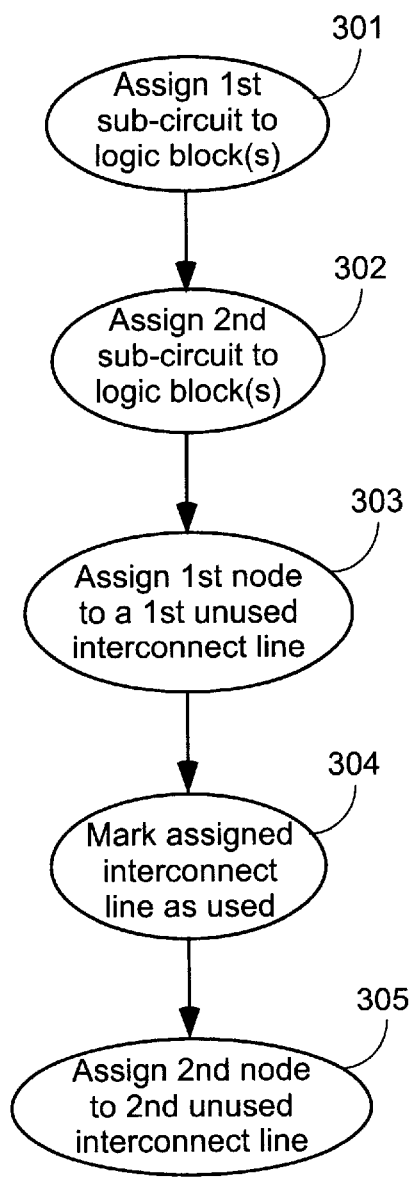
FIG. 3 shows a prior art method for implementing a circuit in a PLD.

FIG. 3 shows how circuits are typically implemented in programmable logic devices (PLDs). PLD implementation software is widely available that performs the steps shown in FIG. 3.

A circuit includes groups of logic (sub-circuits) separated by nodes. The implementation software maps each sub-circuit to one or more logic blocks, and then routes each node between the sub-circuits using interconnect lines and programmable interconnect points (PIPs) that connect the sub-circuits and interconnect lines. A routed node can traverse one or more interconnect lines and one or more PIPs.

In step 301 of FIG. 3, a first sub-circuit is assigned to one or more logic blocks in the PLD. In step 302, a second sub-circuit is assigned to one or more other logic blocks of the PLD. In step 303, a first node (e.g., a node between the two sub-circuits) is assigned to a first unused interconnect line. Interconnect lines that have already been assigned are marked as "used" (step 304), and the routing software does not assign these lines again. Interconnect lines (as well as logic blocks, PIPS, and other PLD resources) are typically marked as used by entering a value in a table that is accessed by the implementation software whenever new resources are allocated. In step 305, a second node is assigned to a second interconnect line from among those interconnect lines that are still unused.

The method of FIG. 3 often assigns two different nodes to two interconnect lines that are separated by a single disabled PIP. If the memory cell controlling this PIP is disturbed by a single event upset, the two interconnect lines can be inadvertently connected (shorted together).

Figure 4:
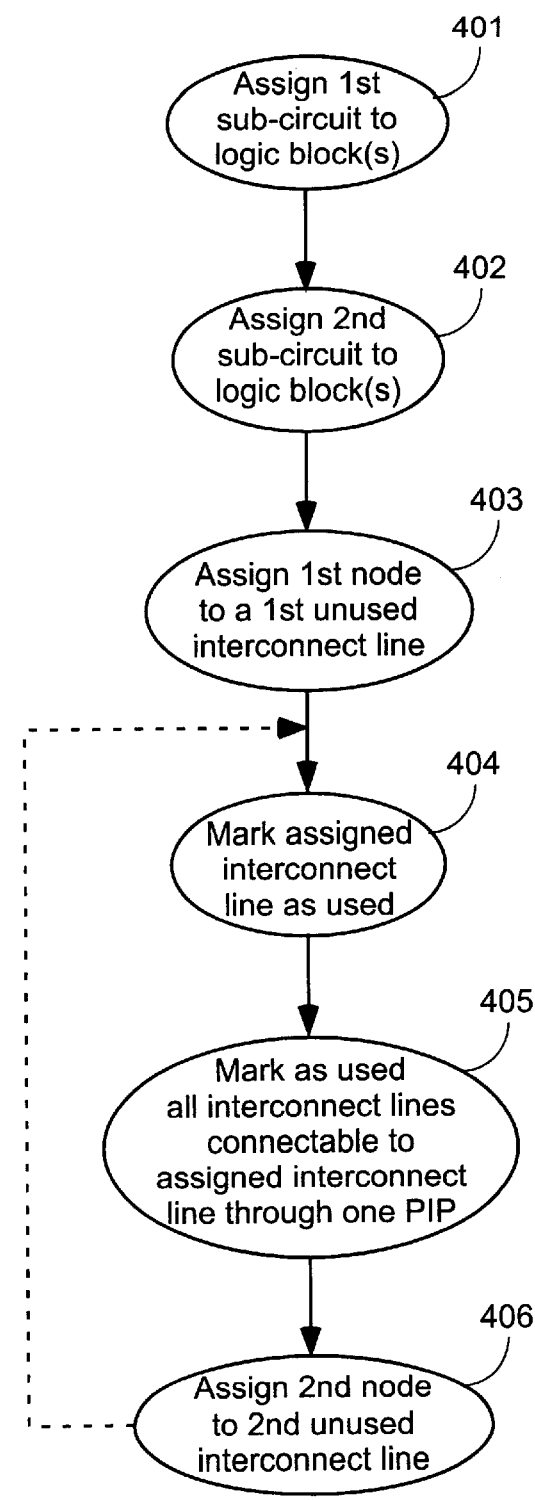
FIG. 4 shows a method for implementing a circuit in a PLD according to a first embodiment of the invention.

FIG. 4 shows a method of implementing a circuit in a PLD according to a first embodiment of the invention. Two nodes assigned to interconnect lines according to the illustrated method cannot be inadvertently shorted together by a single event upset that changes the state of a single PIP.

Steps 401–404 are similar to steps 301–304 of FIG. 3. The sub-circuits are assigned to logic blocks in steps 401 and 402. A first node is routed in step 403, and the assigned interconnect line is marked as used in step 404. However, a new step is included (step 405), in which every interconnect line that can be connected to the assigned interconnect line through a single PIP is also marked as used. Thus, when a second node is assigned to an unused interconnect line in step 406, the two assigned interconnect lines cannot be inadvertently shorted together by a single event upset.

Clearly, for routing-intensive circuits the method of FIG. 4 requires more available interconnect lines than the method of FIG. 3. For example, FIG. 5 shows the interconnect lines marked used (i.e., made unavailable) by routing a single exemplary node.

Assume that a first sub-circuit has been assigned to logic block LB00 (step 401 of FIG. 4), and at second sub-circuit has been assigned to logic block LB10 (step 402). A first node interconnecting the two sub-circuits is then assigned to interconnect lines (step 403) following the path shown in heavy lines in FIG. 3. The assigned path includes, in this example, interconnect lines IL11H, IL11V, and IL20H. In step 404, these three interconnect lines are marked as used.

However, according to step 405, all interconnect lines that can be connected to any of interconnect lines IL11H, IL11V, and IL20H through a single PIP are also marked as used. These interconnect lines are indicated in FIG. 5 using solid (but not heavy) lines. Dashed lines indicate interconnect lines still marked as unused after step 405 is performed. As shown in FIG. 5, interconnect lines IL10V, IL20V, IL10H, IL30H, IL01V, IL21V, IL01H, IL21H, IL02V, and IL12V are all marked as used after routing the first node.

Figure 5:
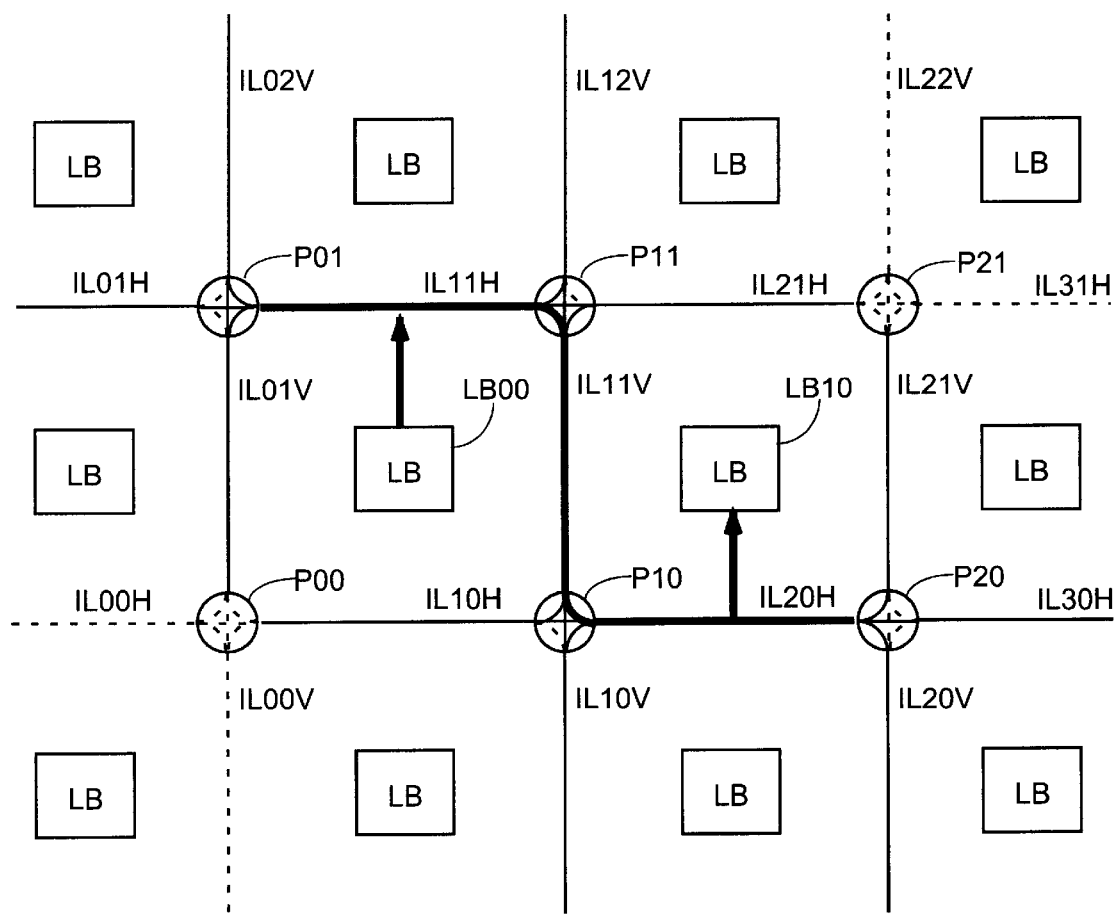
FIG. 5 shows an exemplary circuit implementation that can result from following the methods of the invention.

FIG. 5 is greatly simplified, for clarity, and each logic block typically has many more interconnect lines available than are shown in FIG. 5. Therefore, there are still many interconnect lines available for routing signals in the area of the first routed node. However, the three interconnect lines actually used to route the node resulted in 13 interconnect lines marked as used, including the three "primary" used lines (interconnect lines actually used to route the node) and ten "secondary" used lines (interconnect lines separated from the primary used lines by only one PIP).

The additional resources required to route each node (e.g., the ten secondary used lines in the example of FIG. 5) can be well worthwhile when the circuit will operate in an environment likely to induce single event upsets. However, a modification of the method of FIG. 4 can significantly reduce the effective number of unused; interconnect lines for some applications.

Figure 1:
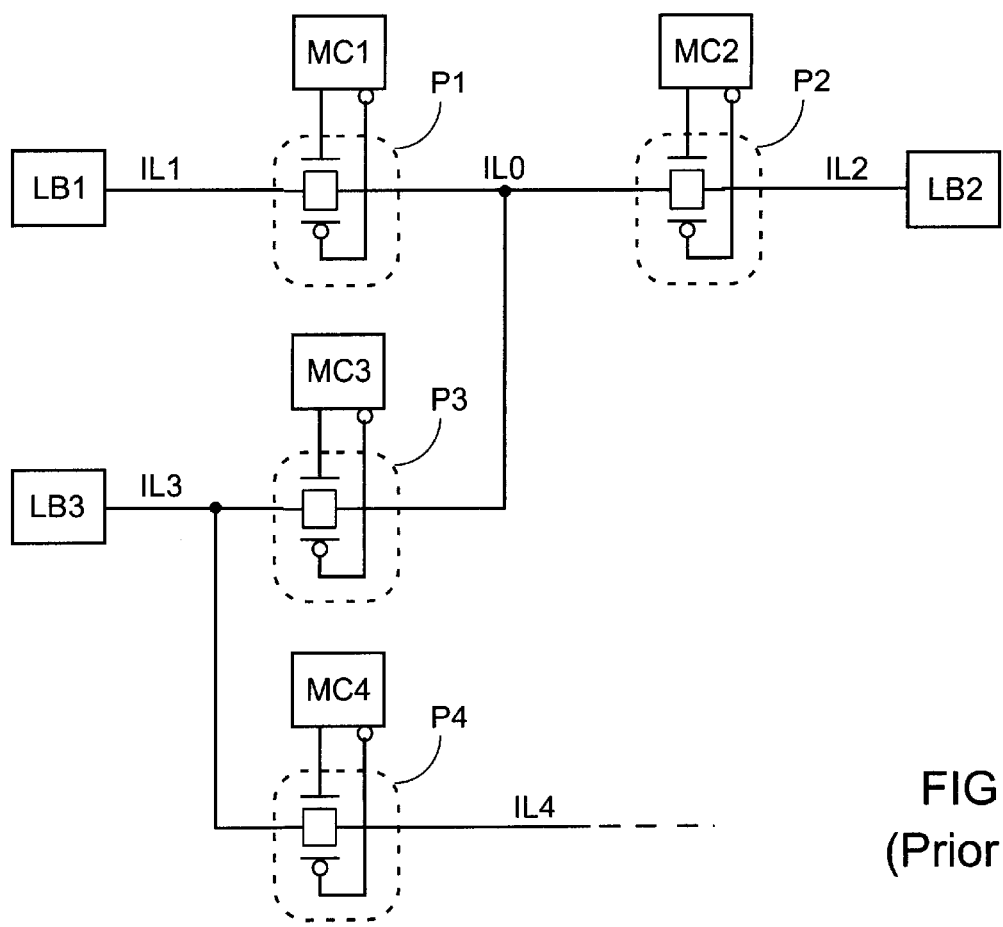
FIG. 1 shows an exemplary structure in a programmable logic device (PLD).
Figure 2:
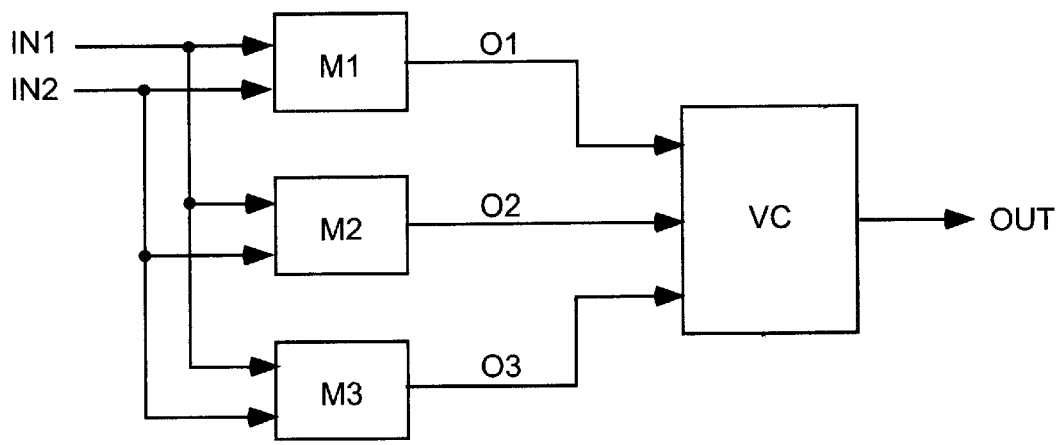
FIG. 2 shows a well-known triple modular redundancy (TMR) circuit.

For example, suppose the circuit to be implemented is a triple modular redundancy (TMR) circuit similar to the circuit shown in FIG. 2. If the first sub-circuit is in a first module (e.g., module M1 of FIG. 2) and the second sub-circuit is in a second module (e.g., module M2), then the secondary interconnect lines must be marked as used to avoid altering two modules with a single event upset. However, if both sub-circuits are in the same module, then it does not matter if both sub-circuits are affected by a single event. If even one sub-circuit is affected, the module output is invalid. Therefore, where both sub-circuits are in the same module, the secondary interconnect lines need not be considered as used.

Clearly, to implement this modified method the circuit implementation software must have the capability to mark an interconnect line as used with respect to some nodes (i.e., nodes in other modules) and unused with respect to other nodes (i.e., nodes in the same module). This capability is easily achieved by modifying the implementation software to mark as used only those secondary interconnect lines associated with nodes that are outside the current module in the TMR implementation.

Identification of the source of each node is straightforward. Because the implementation path must be associated with the logical node, that data is available to the implementation software. Further, implementation software commonly tracks the design hierarchy. It is likely that the three modules in the TMR implementation are three different instances in the hierarchy and would be named accordingly. Thus, the names of the nodes can be used to identify the module in which each node resides, and therefore to identify which nodes must have their secondary interconnect lines excluded from consideration for each node. In the embodiment of FIG. 4, an interconnect line is marked as used when the interconnect line is not to be assigned to a subsequently routed node. However, other embodiments can be envisioned in which interconnect lines are not marked as "used" or "unused".

For example, some known implementation software applies penalty points to assigned interconnect lines rather than banning their use altogether. If use of a previously assigned interconnect line is very important to the successful routing of a circuit, a line can be reassigned. Adapting the principles of the invention to this scenario, penalty points could be applied to secondary interconnect lines, i.e., interconnect lines connectable to assigned interconnect lines through a single PIP. The routing software could gradually raise the number of penalty points until the resulting implementation does not use the secondary interconnect lines.

In one such embodiment, the implementation software reports the number of nodes that would suffer a double-error from a single event upset. This capability is particularly useful when the presence of a small number of such nodes is acceptable to the user.

Figure 6:
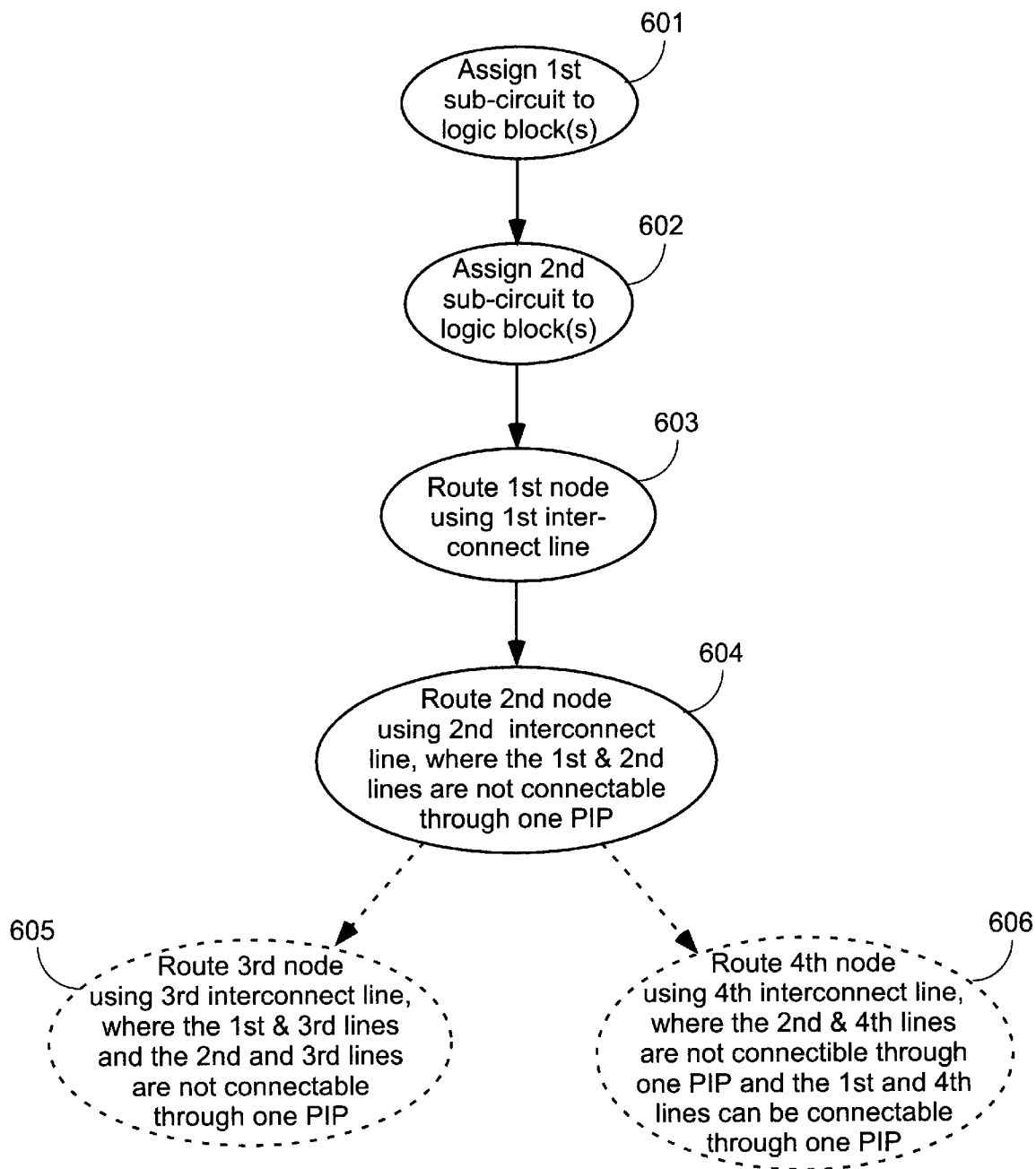
FIG. 6 shows a method for implementing a circuit in a PLD according to a second embodiment of the invention.

FIG. 6 shows a method of implementing a circuit in a PLD according to a second embodiment of the invention. In steps 601 and 602, first and second sub-circuits are assigned to logic blocks in the PLD. In step 603, a first node is routed in the PLD using a first interconnect line. In step 604, a second node is routed in the PLD using a second interconnect line, where connecting the first and second interconnect lines to each other would require the enabling of more than one PIP.

As shown in optional step 605, an additional third node can then be routed while ensuring that connecting either the first and third lines or the second and third lines would require the enabling of more than one PIP.

As described above, some nodes are preferably separated by more than one PIP (i.e., nodes in different modules of a TMR circuit), while other nodes can be separated by only one PIP if desired (i.e., nodes in the same module of a TMR circuit). In optional step 606, a fourth node is routed using a fourth interconnect line, where the second and fourth lines are not connectable through one PIP, but the first and fourth lines are connectable through one PIP or through more than one PIP, whichever is found preferable by the implementation software.

Figure 7:
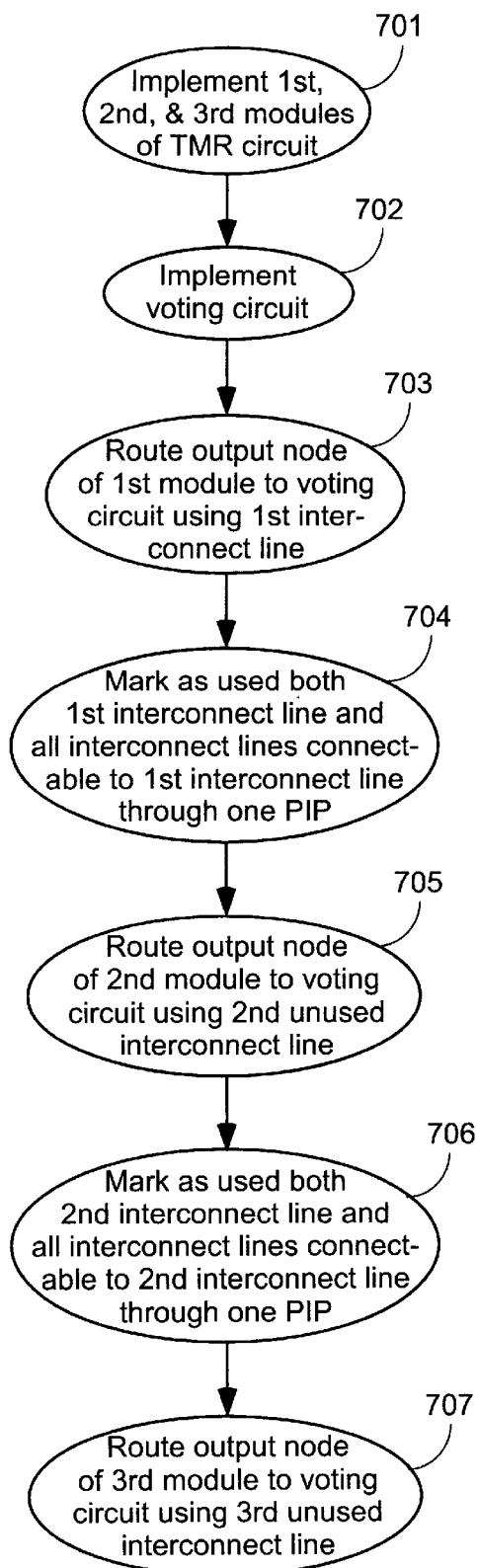
FIG. 7 shows a method for implementing a TMR circuit in a PLD according to a third embodiment of the invention.

FIG. 7 shows a method of implementing a TMR circuit in a PLD according to a third embodiment of the invention. In step 701, the first, second, and third modules of the TMR circuit are implemented in the PLD. In step 702, the voting circuit is implemented in the PLD. In step 703, the output node of the first module is routed to the voting circuit using a first interconnect line. In step 704, both the first interconnect line and all other interconnect lines connectable to the first interconnect line through a single PIP are marked as used.

In step 705, the output node of the second module is routed to the voting circuit using a second unused interconnect line. In step 706, both the second interconnect line and all other interconnect lines connectable to the second interconnect line through a single PIP are marked as used. In step 707, the output node of the third module is routed to the voting circuit using a third unused interconnect line.

Figure 8:
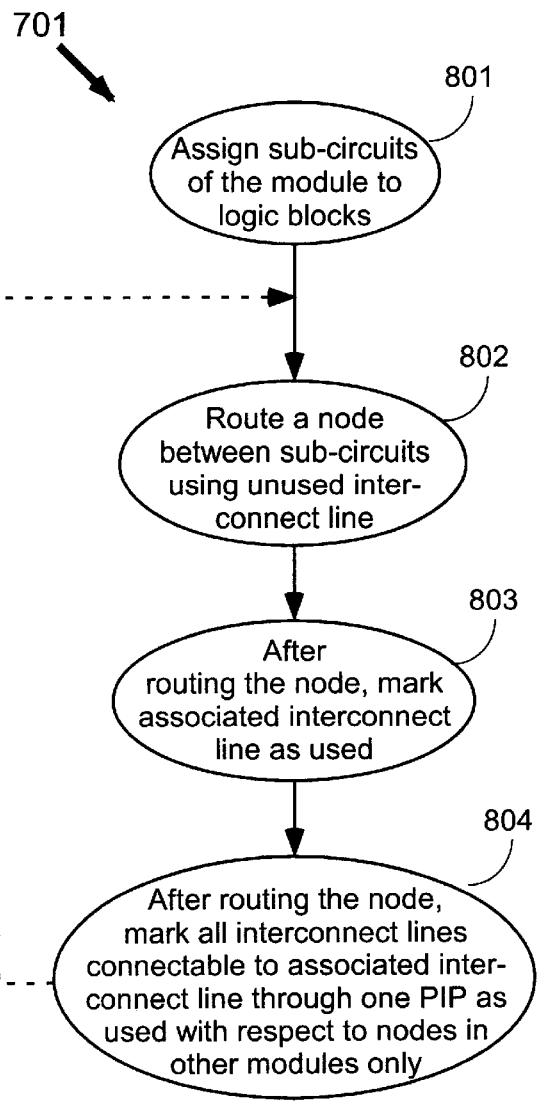
FIG. 8 shows additional details of one step of the method of FIG. 7.

FIG. 8 shows details of step 701 of FIG. 7, according to one embodiment, The steps shown are applied to each of the three modules.

In step 801, sub-circuits of the module are assigned to logic blocks in the PLD. In step 802, a node within the module that connects two or more sub-circuits of the module is routed using an interconnect line marked unused with respect to that node. After routing the node, the associated interconnect line is marked as used with respect to all nodes (step 803). In step 804, all secondary interconnect lines (i.e., those connectable to the associated interconnect line through a single PIP) are marked as used with respect to nodes in other modules of the TMR, but not marked as used with respect to other nodes in the same module. Steps 802–804 are then repeated for other nodes in the module.

Figure 9:
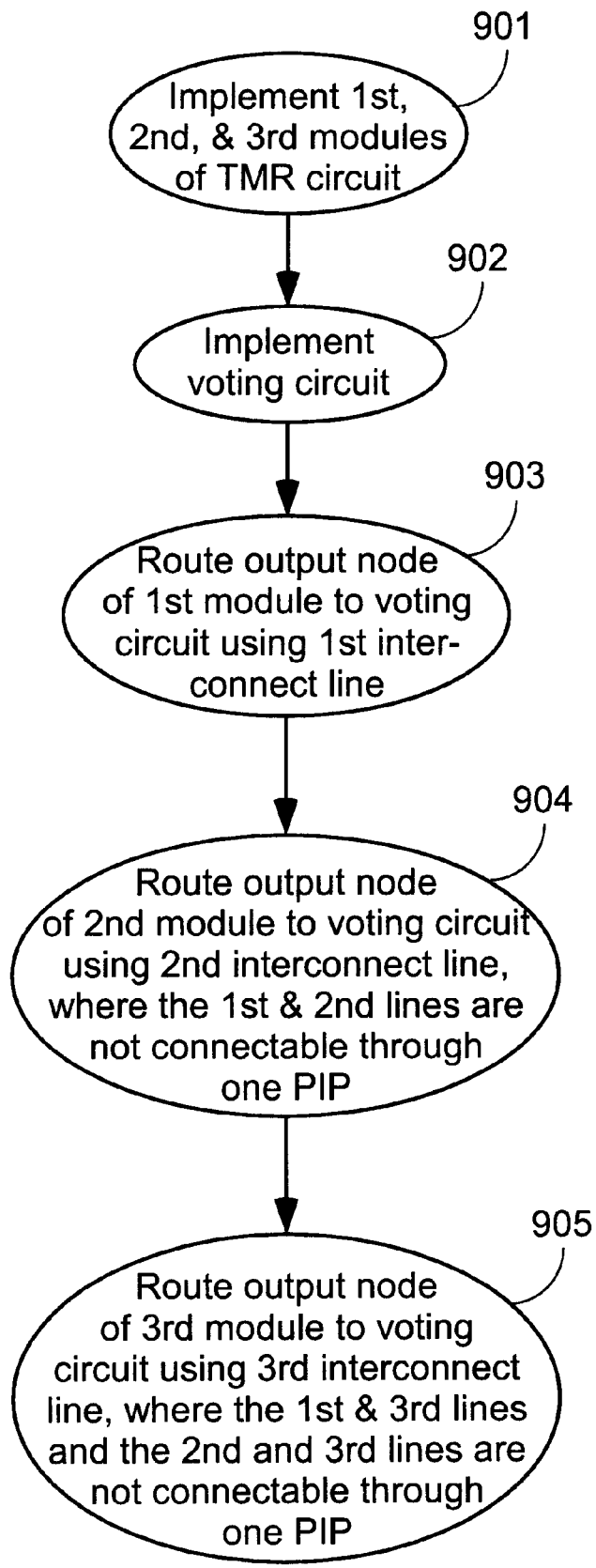
FIG. 9 shows a method for implementing a TMR circuit in a PLD according to a fourth embodiment of the invention.

FIG. 9 shows a method of implementing a TMR circuit in a PLD according to a fourth embodiment of the invention.

In step 901, the first, second, and third modules of the TMR circuit are implemented in the PLD. In step 902, the voting circuit is implemented in the PLD. In step 903, the output node of the first module is routed to the voting circuit using a first interconnect line. In step 904, the output node of the second module is routed to the voting circuit using a second interconnect line, where connecting the first and second interconnect lines to each other would require the enabling of more than one PIP. In step 905, the output node of the third module is routed to the voting circuit using a third interconnect line, where connecting the first and third or the second and third interconnect lines to each other would require the enabling of more than one PIP.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in, any form, DVD, etc.). Further, such software can also be in the form of a computer data signal embodied in a carrier wave, such as that found within the well-known Web pages transferred among computers connected to the Internet. Accordingly, the present invention is not limited to any particular platform.

Those having skill in the relevant arts of the invention will now perceive various modifications and additions that can be made as a result of the disclosure herein. For example, the above text describes the circuits and methods of the invention in the context of PLDs such as field programmable gate arrays (FPGAs). However, the methods of the invention can also be implemented in other PLDs subject to the effects of single event upsets or other kinds of failures such as hot electron trapping in nonvolatile memories, for example, in CPLDs containing flash memories. The invention can also be applied to PLD circuits to avoid the contention that can result from the enablement of a PIP by a single event upset. Further, alternative routing algorithms can be adapted to use the methods of the invention.

Accordingly, all such modifications and additions are deemed to be within the scope of the invention, which is to be limited only by the appended claims and their equivalents.

What is claimed is:

1. A method of implementing a circuit in a programmable logic device (PLD) comprising logic blocks and interconnect lines, the circuit comprising first and second sub-circuits and first and second nodes coupled to the first and second sub-circuits, respectively, the method comprising:

assigning the first sub-circuit to at least one logic block in the PLD;

assigning the second sub-circuit to at least one other logic block in the PLD;

assigning the first node to a first unused interconnect line in the PLD;

marking the first interconnect line as used;

marking all other interconnect lines separated from the first interconnect line by a single programmable interconnect point (PIP) as used; and assigning the second node to a second unused interconnect line in the PLD.

2. The method of claim 1, wherein:
the circuit comprises a triple modular redundancy (TMR) circuit, the first sub-circuit implementing a first module of the TMR circuit and the second sub-circuit implementing a second module of the TMR circuit; and
the circuit further comprises a voting circuit coupled to the first and second modules via the first and second nodes, respectively.

3. The method of claim 1, wherein the circuit comprises a triple modular redundancy (TMR) circuit, the first sub-circuit implementing a module of the TMR circuit and the second sub-circuit implementing a voting circuit.

4. The method of claim 1, the circuit further comprising a third node, the method further comprising:
marking the second interconnect line as used;
marking all other interconnect lines separated from the second interconnect line by a single PIP as used; and
assigning the third node to a third unused interconnect line in the PLD.

5. The method of claim 1, the circuit further comprising a fourth node coupled to the first sub-circuit, wherein:
marking the first interconnect line as used comprises marking the first interconnect line as used with respect to both of the second and fourth nodes; and
marking all other interconnect lines separated from the first interconnect line by a single PIP as used comprises marking the all other interconnect lines separated from the first interconnect line by a single PIP as used with respect to the second node and not with respect to the fourth node.

6. A method of implementing a circuit in a programmable logic device (PLD) comprising logic blocks and interconnect lines programmably interconnected using programmable interconnect points (PIPs), the circuit comprising first and second sub-circuits and first and second nodes coupled to the first and second sub-circuits, respectively, the method comprising:
assigning the first sub-circuit to at least one logic block in the PLD;
assigning the second sub-circuit to at least one other logic block in the PLD;
routing the first node using a first interconnect line in the PLD; and
routing the second node using a second interconnect line in the PLD wherein connecting the first and second interconnect lines to each other would require the enabling of more than one PIP.

7. The method of claim 6, wherein:
the circuit comprises a triple modular redundancy (TMR) circuit, the first sub-circuit implementing a first module of the TMR circuit and the second sub-circuit implementing a second module of the TMR circuit; and
the circuit further comprises a voting circuit coupled to the first and second modules via the first and second nodes, respectively.

8. The method of claim 6, wherein the circuit comprises a triple modular redundancy (TMR) circuit, the first sub-circuit implementing a module of the TMR circuit and the second sub-circuit implementing a voting circuit.

9. The method of claim 6, the circuit further comprising a third node, the method further comprising:
routing the third node using a third interconnect line in the PLD wherein connecting the first and third interconnect lines to each other would require the enabling of more than one PIP and wherein connecting the second and third interconnect lines to each other would require the enabling of more than one PIP.

10. The method of claim 6, the circuit further comprising a fourth node coupled to the first sub-circuit, the method further comprising:
routing the fourth node using a fourth interconnect line in the PLD wherein connecting the second and fourth interconnect lines to each other would require the enabling of more than one PIP and wherein connecting the first and fourth interconnect lines to each other would require the enabling of one or more PIPs.

11. A method of implementing a triple modular redundancy (TMR) circuit in a programmable logic device (PLD), the method comprising:
implementing first, second, and third modules of the TMR circuit in the PLD;
implementing a voting circuit in the PLD;
routing an output node of the first module to a first input terminal of the voting circuit using a first interconnect line of the PLD;
marking as used both the first interconnect line and all interconnect lines programmably connectable to the first interconnect line through a single programmable interconnect point (PIP);
routing an output node of the second module to a second input terminal of the voting circuit using a second unused interconnect line of the PLD;
marking as used both the second interconnect line and all interconnect lines programmably connectable to the second interconnect line through a single PIP; and
routing an output node of the third module to a third input terminal of the voting circuit using a third unused interconnect line of the PLD.

12. The method of claim 11, wherein implementing the first, second, and third modules comprises, for each module:
assigning sub-circuits of the module to logic blocks in the PLD;
routing each node between the sub-circuits using unused interconnect lines in the PLD;
marking, after routing each node, each associated interconnect line used by the node as used with respect to all other nodes; and
marking, after routing each node, all interconnect lines programmably connectable to the associated interconnect line through a single programmable interconnect point (PIP) as used with respect to nodes in other modules and not with respect to nodes in the same module.

13. The method of claim 11, wherein:
marking as used both the first interconnect line and all interconnect lines programmably connectable to the first interconnect line through a single PIP comprises marking the first interconnect line as used with respect to all nodes, and further comprises marking the all interconnect lines programmably connectable to the first interconnect line through a single PIP as used with respect to the output nodes of the second and third modules; and
marking as used both the second interconnect line and all interconnect lines programmably connectable to the second interconnect line through a single PIP comprises marking the second interconnect line as used with respect to all nodes, and further comprises marking the all interconnect lines programmably connectable to the second interconnect line through a single PIP as used with respect to the output node of the third module.

14. A method of implementing a triple modular redundancy (TMR) circuit in a programmable logic device (PLD), the method comprising:

implementing first, second, and third modules of the TMR circuit in the PLD;

implementing a voting circuit in the PLD;

routing an output node of the first module to a first input terminal of the voting circuit using a first interconnect line of the PLD;

routing an output node of the second module to a second input terminal of the voting circuit using a second unused interconnect line of the PLD wherein connecting the first and second interconnect lines to each other would require the enabling of more than one programmable interconnect point (PIP); and routing an output node of the third module to a third input terminal of the voting circuit using a third unused interconnect line of the PLD wherein connecting the first and third interconnect lines to each other would require the enabling of more than one PIP and wherein connecting the second and third interconnect lines to each other would require the enabling of more than one PIP.

15. The method of claim 14, wherein implementing the first, second, and third modules comprises, for each module:

assigning sub-circuits of the module to logic blocks in the PLD; and routing each node between the sub-circuits using associated interconnect lines in the PLD wherein connecting the associated interconnect lines to interconnect lines previously associated with sub-circuits in other modules would require the enabling of more than one PIP, and wherein connecting the associated interconnect lines to interconnect lines previously associated with sub-circuits in the same module would require the enabling of one or more PIPs.

16. A programmable logic device (PLD) configured to implement a circuit having reduced sensitivity to single event upsets, the circuit comprising first and second nodes, the PLD comprising:

a first plurality of interconnect lines and programmable interconnect points (PIPs) configured to implement the first node; and a second plurality of interconnect lines and PIPs configured to implement the second node, wherein the sensitivity of the circuit to single event upsets is reduced by ensuring that no interconnect line from the first plurality of interconnect lines can be connected to any interconnect line from the second plurality of interconnect lines by the enablement of a single PIP.

17. The PLD of claim 16, wherein the circuit comprises a triple modular redundancy (TMR) circuit comprising three modules and a voting circuit.

18. The PLD of claim 17, wherein:

the first node is in a first one of the modules; and the second node is in a second one of the modules.

19. The PLD of claim 17, wherein:

the first node is in a first one of the modules; and the second node is in the voting circuit.

20. A method of implementing a circuit in a programmable logic device (PLD) comprising interconnect lines and programmable interconnect points (PIPs), the circuit comprising first and second nodes, the method comprising:

assigning a first group of interconnect lines and PIPs to the first node; and assigning a second group of interconnect lines and PIPs to the second node while ensuring that no single event upset can cause a change of state to signals on interconnect lines in both of the first and second groups.

21. The method of claim 20, wherein the change of state comprises an inadvertent connection between a first interconnect line in the first group of interconnect lines and PIPs and a second interconnect line in the second group of interconnect lines and PIPs.

22. The method of claim 20, wherein:

the PLD further comprises configuration memory cells controlling the PIPs; and the single event upset comprises a change of state in one of the configuration memory cells controlling a PIP between a first interconnect line in the first group of interconnect lines and PIPs and a second interconnect line in the second group of interconnect lines and PIPs.

23. The method of claim 20, wherein assigning a second group of interconnect lines and PIPs to the second node comprises:

marking all interconnect lines in the first group of interconnect lines and PIPs as used;

marking as used all other interconnect lines separated by a single PIP from any interconnect line in the first group of interconnect lines and PIPs; and assigning the second node to one or more interconnect lines in the PLD not marked as used.

24. The method of claim 20, wherein the first group of interconnect lines and PIPs includes exactly one interconnect line.

25. The method of claim 20, wherein the second group of interconnect lines and PIPs includes exactly one interconnect line.

* * * * *